US012772867B2

(12) United States Patent
Hatta et al.

(10) Patent No.: US 12,772,867 B2
(45) Date of Patent: Oct. 20, 2026

(54) SEMICONDUCTOR MODULE

(71) Applicant: Mitsubishi Electric Corporation, Tokyo (JP)

(72) Inventors: Hideyuki Hatta, Tokyo (JP); Shinichi Kinouchi, Tokyo (JP); Hayato Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 257 days.

(21) Appl. No.: 17/698,371

(22) Filed: Mar. 18, 2022

(65) Prior Publication Data

US 2023/0032035 A1 Feb. 2, 2023

(30) Foreign Application Priority Data

Jul. 27, 2021 (JP) ................................. 2021-122105

(51) Int. Cl.
*H01L 23/492* (2006.01)
*H01L 23/00* (2006.01)
(Continued)

(52) U.S. Cl.
CPC ........... *H10W 70/24* (2026.01); *H10W 70/22* (2026.01); *H10W 90/00* (2026.01);
(Continued)

(58) Field of Classification Search
CPC ....... H01L 23/34; H01L 23/36; H01L 23/367; H01L 23/4924; H01L 23/4922;
(Continued)

(56) References Cited

U.S. PATENT DOCUMENTS

2003/0022464 A1* 1/2003 Hirano .................... H01L 24/73
257/E23.102
2013/0049077 A1 2/2013 Herbsommer et al.
(Continued)

FOREIGN PATENT DOCUMENTS

CN 102983114 A 3/2013
JP 2002-199700 A 7/2002
(Continued)

OTHER PUBLICATIONS

Office Action dated Sep. 13, 2022 issued by the Japanese Patent Office in Japanese Application No. 2021-122105.
(Continued)

*Primary Examiner* — Leonard Chang
*Assistant Examiner* — Stanetta D Isaac
(74) *Attorney, Agent, or Firm* — Sughrue Mion, PLLC

(57) ABSTRACT

Provided is a small-sized inexpensive semiconductor module in which increase of ON resistance and increase of turn-off surge voltage at low temperature are suppressed. The semiconductor module includes: a semiconductor switching element; and a stress application portion provided on one or each of a first surface and a second surface on an opposite side to the first surface of the semiconductor switching element, having a linear expansion coefficient larger than that of a main material of the semiconductor switching element, and having a larger thickness than the semiconductor switching element. The stress application portion generates compressive or tensile stress in the semiconductor switching element through thermal shrinkage or expansion of the stress application portion due to change in temperature. A threshold voltage at which the semiconductor switching element is turned on, decreases in association with increase of a magnitude of the compressive or tensile stress in the semiconductor switching element.

13 Claims, 18 Drawing Sheets

(51) Int. Cl.

| | |
|---|---|
| ***H01L 25/07*** | (2006.01) |
| ***H10W 70/20*** | (2026.01) |
| ***H10W 72/00*** | (2026.01) |
| ***H10W 72/30*** | (2026.01) |
| ***H10W 90/00*** | (2026.01) |

(52) U.S. Cl.
CPC .... *H10W 72/07354* (2026.01); *H10W 72/347* (2026.01); *H10W 72/352* (2026.01); *H10W 90/736* (2026.01); *H10W 90/796* (2026.01)

(58) Field of Classification Search
CPC ............... H01L 23/4334; H01L 23/492; H01L 23/49562; H01L 23/49575; H01L 23/585; H01L 23/62; H01L 24/29; H01L 24/32; H01L 24/08; H01L 24/33; H01L 24/40; H01L 24/72; H01L 2224/08245; H01L 2224/29139; H01L 2224/29147; H01L 2224/32245; H01L 2224/33181; H10W 90/00; H10W 90/736; H10W 90/796; H10W 90/811; H10W 40/778; H10W 40/10; H10W 70/24; H10W 70/22; H10W 70/20; H10W 70/481; H10W 42/80; H10W 42/00; H10W 72/07354; H10W 72/347; H10W 72/352; H10W 72/00; H10W 72/30; H10W 72/60
See application file for complete search history.

(56) References Cited

U.S. PATENT DOCUMENTS

| | | | | |
|---|---|---|---|---|
| 2016/0233141 | A1* | 8/2016 | Hirobe .................... | H01L 23/10 |
| 2017/0117208 | A1* | 4/2017 | Kasztelan ......... | H01L 23/49562 |
| 2020/0335411 | A1* | 10/2020 | Rokubuichi ............ | H01L 24/82 |

FOREIGN PATENT DOCUMENTS

| | | | |
|---|---|---|---|
| JP | 2009-4800 | A | 1/2009 |
| JP | 2009-252956 | A | 10/2009 |

OTHER PUBLICATIONS

Communication dated Jan. 26, 2026, issued in Chinese Application No. 202210774027.0.

Communication dated Jun. 3, 2026, issued in Chinese Application No. 202210774027.0.

* cited by examiner

SEMICONDUCTOR MODULE

BACKGROUND OF THE INVENTION

1. Field of the Invention

The present disclosure relates to a semiconductor module.

2. Description of the Background Art

Power conversion devices such as AC/DC converters, DC/DC converters, and inverters are used in the field of power electronics. The power conversion devices include a semiconductor module for converting power through a switching operation of a semiconductor switching element. The semiconductor switching element implemented by a power semiconductor is, for example, a metal oxide semiconductor field effect transistor (MOSFET) or an insulated-gate bipolar transistor (IGBT). In general, these semiconductor switching elements have three electrodes, i.e., a gate, a source, and a drain (alternatively, a gate, an emitter, and a collector). The semiconductor switching element changes a gate voltage which is a voltage to be applied to the gate, to control high current that flows between the source (emitter) and the drain (collector).

A gate voltage necessary for causing a current having at least a predetermined fixed value to flow between the source and the drain (between the emitter and the collector) in the semiconductor switching element, is called a threshold voltage (Vth). In general, the threshold voltage is negatively dependent on temperature. That is, the threshold voltage decreases in association with increase of the temperature of the semiconductor switching element. On the contrary, the threshold voltage increases in association with decrease of the temperature of the semiconductor switching element. Increase of the threshold voltage leads not only to increase of the ON resistance (channel resistance) of the semiconductor switching element, but also to increase of a turn-off speed at the time of a switching operation of the semiconductor switching element so that a turn-off surge voltage also increases. If the increase of the ON resistance causes increase of steady loss, heat generation from the semiconductor switching element cannot be suppressed. Meanwhile, if the turn-off surge voltage increases, the voltage may exceed a rated voltage of the semiconductor switching element. In order to inhibit these drawbacks, the drawbacks are addressed by, in designing of the semiconductor switching element, setting a current-conduction area of the semiconductor switching element to be large and setting the rated voltage of the semiconductor switching element to be high.

In the case of setting the current-conduction area of the semiconductor switching element to be large, a material cost per semiconductor switching element increases, and thus cost for the semiconductor module increases. Further, the size of the contained semiconductor switching element increases, and thus the size of the semiconductor module increases. In the case of setting the rated voltage of the semiconductor switching element to be high, cost for processing of the semiconductor switching element increases since, for example, a withstand voltage retaining layer is formed to have a large thickness. Further, the ON resistance of the semiconductor switching element also increases in association with the increase of the thickness of the withstand voltage retaining layer. Thus, the area, of the semiconductor switching element, that is necessary for suppressing heat generation increases. Therefore, the cost for the semiconductor switching element increases, and the size of the semiconductor module increases. In this manner, since the threshold voltage of the semiconductor switching element has a negative temperature characteristic, a drawback arises in that the negative temperature characteristic leads to increase of the cost for the semiconductor module and increase of the size thereof.

Against the above drawback, a technology of providing a switching circuit has been disclosed, and, in the switching circuit, resistors that are included in a gate drive circuit and that influence a gate drive speed are set to be variable depending on element temperatures (see, for example, Patent Document 1). In the disclosed technology, increase of turn-off surge voltage is suppressed by switching the resistors in the gate drive circuit, whereby increase of the rated voltage of a semiconductor switching element can be suppressed.

Patent Document 1: Japanese Laid-Open Patent Publication No. 2002-199700

In a configuration of a semiconductor power conversion device in the above Patent Document 1, the resistors in the gate drive circuit can be switched according to the temperature of the semiconductor switching element, whereby increase of turn-off surge voltage can be suppressed. However, in the case of switching the resistors in the gate drive circuit according to the temperature of the semiconductor switching element, the temperature of the semiconductor switching element needs to be monitored and the resistance value of the gate drive circuit needs to be controlled, whereby a large number of components need to be added. Consequently, drawbacks arise in that: cost for a semiconductor module increases; and the size of the semiconductor module increases. Further, a drawback arises in that cost for manufacturing the semiconductor module increases in order to adapt to complication of control and increase of the number of patterns of failures.

SUMMARY OF THE INVENTION

Considering this, an object of the present disclosure is to provide a small-sized inexpensive semiconductor module in which increase of ON resistance and increase of turn-off surge voltage at low temperature are suppressed.

A semiconductor module according to the present disclosure includes: a semiconductor switching element; and a stress application portion provided on one or each of a first surface and a second surface on an opposite side to the first surface of the semiconductor switching element, the stress application portion having a linear expansion coefficient larger than a linear expansion coefficient of a main material of the semiconductor switching element, the stress application portion having a larger thickness than the semiconductor switching element, wherein the stress application portion generates compressive stress or tensile stress in the semiconductor switching element through thermal shrinkage or thermal expansion of the stress application portion due to change in temperature, and a threshold voltage at which the semiconductor switching element is turned on, decreases in association with increase of a magnitude of the compressive stress or the tensile stress in the semiconductor switching element.

The semiconductor module according to the present disclosure includes a stress application portion provided on one or each of a first surface and a second surface on an opposite side to the first surface of the semiconductor switching element, the stress application portion having a linear expansion coefficient larger than a linear expansion coefficient of a main material of the semiconductor switching element, the stress application portion having a larger thickness than the semiconductor switching element. The stress application portion generates compressive stress or tensile stress in the semiconductor switching element through thermal shrinkage or thermal expansion of the stress application portion due to change in temperature. A threshold voltage at which the semiconductor switching element is turned on, decreases in association with increase of a magnitude of the compressive stress or the tensile stress in the semiconductor switching element. Consequently, increase of ON resistance and increase of turn-off surge voltage can be suppressed. Thus, the area of the semiconductor switching element and the rated voltage of the semiconductor switching element can be decreased. Therefore, a small-sized inexpensive semiconductor module can be obtained.

DETAILED DESCRIPTION OF THE PREFERRED EMBODIMENTS OF THE INVENTION

Figure 1:
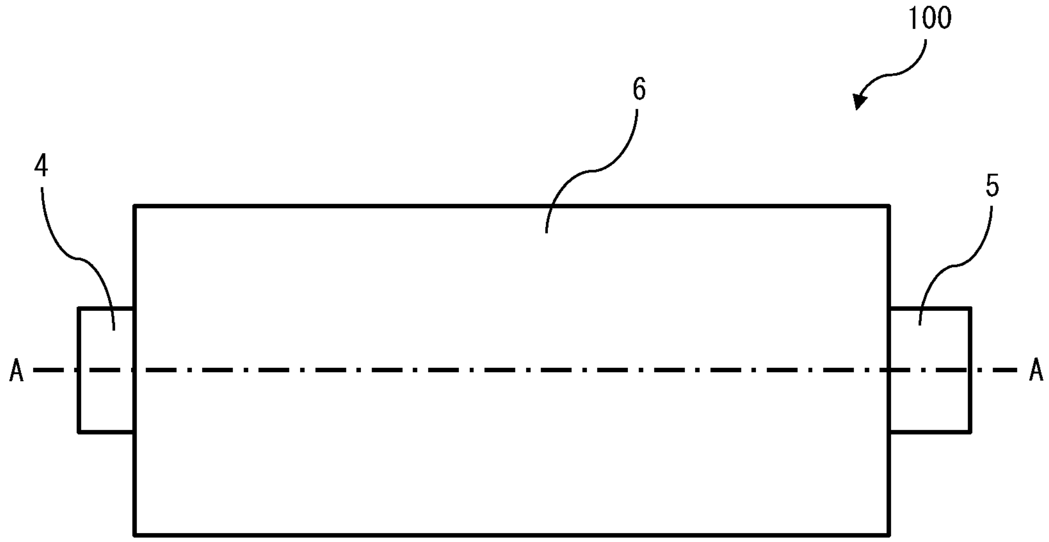
FIG. 1 is a plan view schematically showing the outer appearance of a semiconductor module according to a first embodiment.

Hereinafter, semiconductor modules according to embodiments of the present disclosure will be described with reference to the drawings. Description will be given while the same or corresponding members and portions in the drawings are denoted by the same reference characters.

First Embodiment

Figure 2:
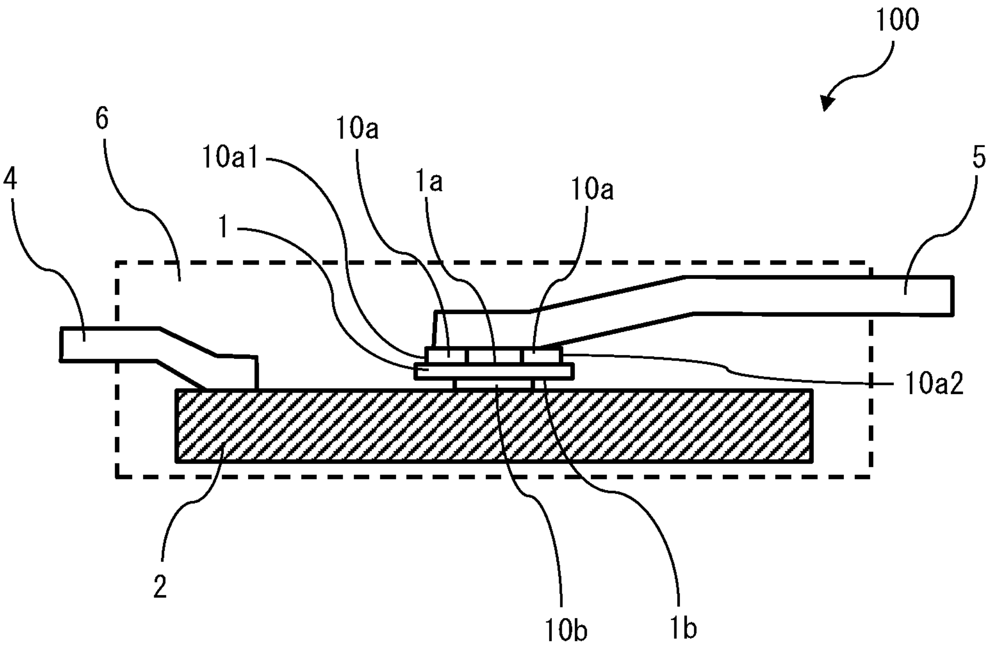
FIG. 2 is a cross-sectional view schematically showing the semiconductor module, taken at the cross-sectional position A-A in FIG. 1.
Figure 3:
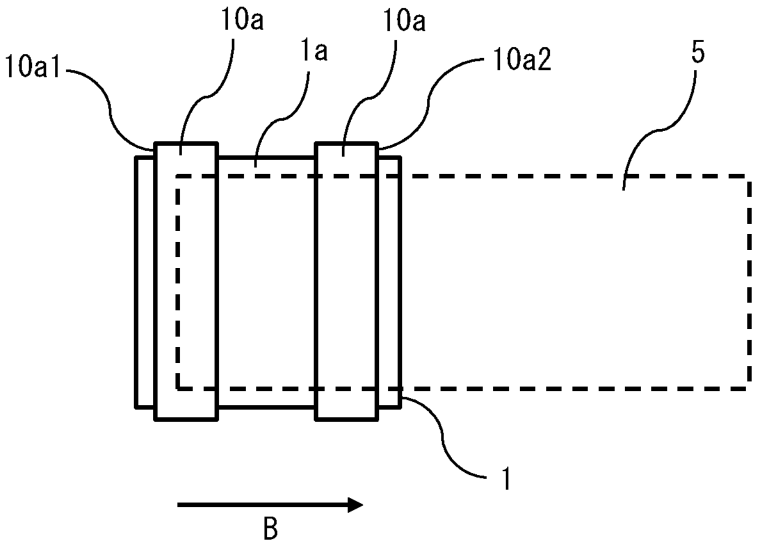
FIG. 3 is a plan view showing a major part of the semiconductor module according to the first embodiment.
Figure 4:
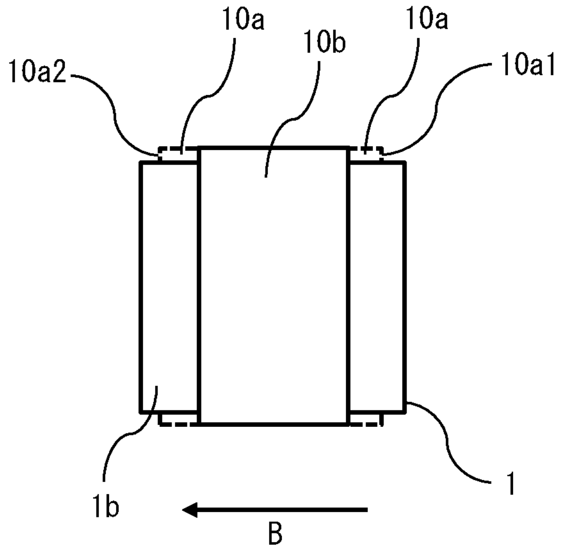
FIG. 4 is another plan view showing the major part of the semiconductor module according to the first embodiment.
Figure 5:
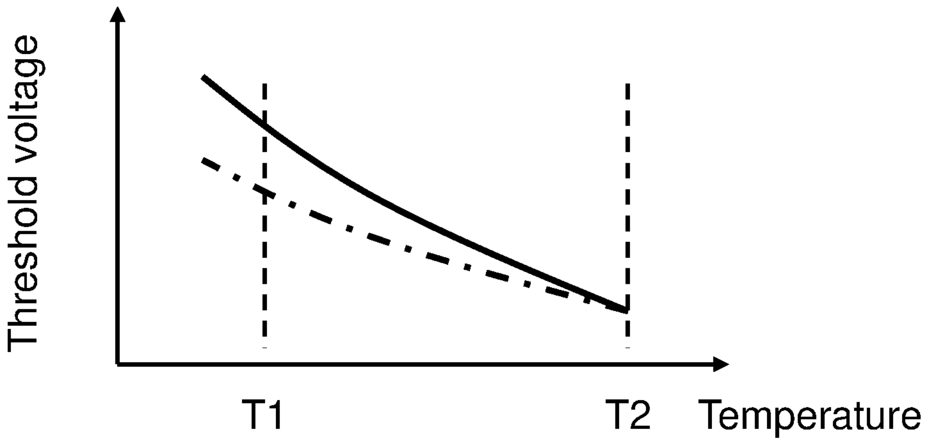
FIG. 5 is a diagram showing an example of a temperature characteristic of a threshold voltage of a semiconductor switching element in the semiconductor module according to the first embodiment.
Figure 6:
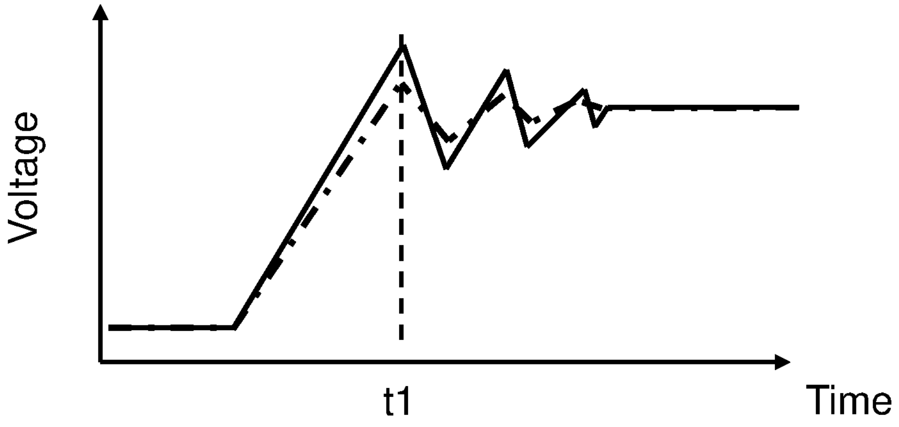
FIG. 6 is a diagram showing an example of the waveform of voltage that is applied to the semiconductor switching element in the semiconductor module according to the first embodiment.
Figure 7:
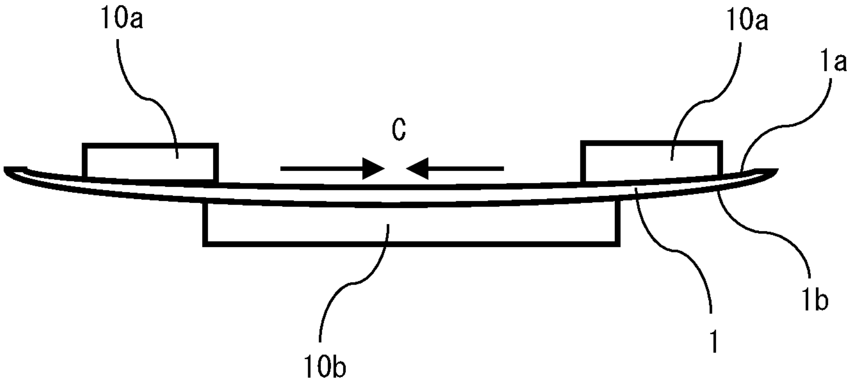
FIG. 7 is a diagram for schematically explaining compressive stress generated in the semiconductor switching element in the semiconductor module according to the first embodiment.

FIG. 1 is a plan view schematically showing the outer appearance of a semiconductor module 100 according to a first embodiment. FIG. 2 is a cross-sectional view schematically showing the semiconductor module 100, taken at the cross-sectional position A-A in FIG. 1. FIG. 3 is a plan view showing a major part of the semiconductor module 100. FIG. 3 shows portions that are a first surface 1*a* side of a semiconductor switching element 1, stress application portions 10*a*, and a busbar 5 (broken line) while excluding an insulating resin material 6. FIG. 4 is another plan view showing the major part of the semiconductor module 100. FIG. 4 shows portions that are a second surface 1*b* side of the semiconductor switching element 1, a stress application portion 10*b*, and the stress application portions 10*a* (broken lines) while excluding the insulating resin material 6. FIG. 5 is a diagram showing an example of a temperature characteristic of a threshold voltage of the semiconductor switching element 1 in the semiconductor module 100. FIG. 6 is a diagram showing an example of the waveform of voltage that is applied to the semiconductor switching element 1 in the semiconductor module 100. FIG. 7 is a diagram for schematically explaining compressive stress generated in the semiconductor switching element 1 in the semiconductor module 100. The semiconductor module 100 for power conversion is mounted to a power conversion device that mainly converts a desired level of power into DC voltage or AC voltage. The semiconductor module 100 includes therein the semiconductor switching element 1 such as a metal oxide semiconductor field effect transistor (MOSFET) and an insulated-gate bipolar transistor (IGBT). The semiconductor module 100 converts power through a switching operation of the semiconductor switching element 1.

<Semiconductor Module 100>

As shown in FIG. 2, the semiconductor module 100 includes the semiconductor switching element 1, the stress application portions 10*a* and 10*b*, a heat dissipating member 2, busbars 4 and 5, and the insulating resin material 6 coating these components. In FIG. 2, the external shape of the insulating resin material 6 is indicated by a broken line. The stress application portions 10*a* are provided between the semiconductor switching element 1 and the busbar 5, and the stress application portion 10*b* is provided between the semiconductor switching element 1 and the heat dissipating member 2. The busbars 4 and 5 are provided such that parts thereof are exposed to outside from the insulating resin material 6, as shown in FIG. 1. The busbars 4 and 5 are, at the parts thereof exposed to outside, connected to external devices. Each of the busbars 4 and 5 is made of, for example, copper having high electric conductivity.

In the present embodiment, in the semiconductor switching element 1 implemented by a power semiconductor such as an MOSFET or an IGBT, a surface on the side on which a channel region is formed and a source electrode (emitter electrode) is present is referred to as the first surface 1*a* which is a front surface of the semiconductor switching element 1, and a surface on the side on which a drain electrode (collector electrode) is formed is referred to as the second surface 1*b* which is a rear surface of the semiconductor switching element 1. Hereinafter, description will be given such that, throughout the cross-sectional views of the semiconductor module 100, the first surface 1*a* of the semiconductor switching element 1 faces the upper side of each drawing and the second surface 1*b* thereof faces the lower side of each drawing unless otherwise noted. A main material of the semiconductor switching element 1 is a semiconductor material such as silicon, silicon carbide, or gallium oxide. For the semiconductor switching element 1, a compound semiconductor that is a wide-bandgap semiconductor having a wider bandgap than silicon can be used. The compound semiconductor is, owing to material physical properties thereof, excellent as a device used for a power conversion device and is harder than silicon. Further, in general, a semiconductor switching element 1 made of either of silicon carbide and gallium oxide is formed to have a smaller thickness than a semiconductor switching element 1 made of silicon.

The busbar 5 is connected to portions, of the stress application portions 10*a* provided on the first surface 1*a*, that are located on an opposite side to the semiconductor switching element 1 side. In FIG. 3, the external shape of the busbar 5 is indicated by a broken line. The busbar 5 and the stress application portions 10*a* are connected to each other by means of, for example, solder. The heat dissipating member 2 is connected to a portion, of the stress application portion 10*b* provided on the second surface 1*b*, that is located on an opposite side to the semiconductor switching element 1 side. The heat dissipating member 2 has a function of an electrode connected to the second surface 1*b*, and the busbar 4 is connected to the heat dissipating member 2. Although the heat dissipating member 2 is, for example, made of copper and formed in the shape of a rectangular plate, the heat dissipating member 2 is not limited thereto and may have the shape of a block. The heat dissipating member 2 is thermally and electrically connected to the semiconductor switching element 1 and dissipates heat generated in the semiconductor switching element 1, to outside. Further, the heat dissipating member 2 dissipates heat generated in the busbar 5 via the semiconductor switching element 1, to outside. The heat dissipating member 2 and the stress application portion 10*b* are connected to each other by means of, for example, solder.

<Stress Application Portions 10*a* and 10*b*>

The stress application portion is provided on one or each of the first surface 1*a* and the second surface 1*b* on an opposite side to the first surface 1*a* of the semiconductor switching element 1. In the present embodiment, as shown in FIG. 3, two stress application portions 10*a* are provided on the first surface 1*a*. Meanwhile, as shown in FIG. 4, one stress application portion 10*b* is provided on the second surface 1*b*. The two stress application portions 10*a* provided on the first surface 1*a* are disposed at an interval in a first direction (the direction of the arrow B shown in FIG. 3) parallel to the first surface 1*a*. As seen in a direction perpendicular to the first surface 1*a*, the one stress application portion 10*b* provided on the second surface 1*b* is disposed between an end 10*a*1 on one side in the first direction of the stress application portion 10*a* that is provided on the first surface 1*a* so as to be located on the one side in the first direction, and an end 10*a*2 on another side in the first direction of the stress application portion 10*a* that is provided on the first surface 1*a* so as to be located on the other side in the first direction.

The stress application portions 10*a* and 10*b* each have a linear expansion coefficient larger than a linear expansion coefficient of the main material of the semiconductor switching element 1. The stress application portions 10*a* and 10*b* each have a larger thickness than the semiconductor switching element 1. The stress application portions 10*a* and 10*b* are each made of, for example, copper having a thickness of 1 mm or larger. The material of the stress application portions 10*a* and 10*b* is not limited to copper and may be another material such as aluminum. If the stress application portions 10*a* and 10*b* are made of copper, the stress application portions 10*a* and 10*b* made of copper undergo thermal shrinkage owing to decrease of temperature. Each stress application portion 10*a* is connected to the busbar 5, and the stress application portion 10*b* is connected to the heat dissipating member 2 having the function of the electrode. Considering this, the stress application portions 10*a* and 10*b* are each desirably made of a material having an excellent electric conductivity and heat conductivity. However, the material of the stress application portions 10*a* and 10*b* is not limited to a material having an excellent electric conductivity and heat conductivity, and a configuration may be employed in which: the busbar 5 is connected to the semiconductor switching element 1 with no stress application portions 10*a* therebetween; and the heat dissipating member 2 is connected to the semiconductor switching element 1 with no stress application portion 10*b* therebetween.

With such a configuration, the stress application portions 10*a* and 10*b* generate compressive stress or tensile stress in the semiconductor switching element 1 through thermal shrinkage or thermal expansion of the stress application portions 10*a* and 10*b* due to change in temperature. As shown in FIG. 7, if the stress application portions 10*a* and 10*b* undergo thermal shrinkage, compressive stresses in directions indicated by two arrows C are generated on the first surface 1*a* side of the semiconductor switching element 1. If the stress application portions 10*a* and 10*b* undergo thermal expansion, tensile stresses are generated on the first surface 1*a* side of the semiconductor switching element 1.

The semiconductor switching element 1 and each of the stress application portions 10*a* and 10*b* are joined together via a joining layer (not shown) so as not to slip on each other. If the semiconductor switching element 1 and each of the stress application portions 10*a* and 10*b* are connected to each other via the joining layer, stress can be efficiently applied from the stress application portions 10*a* and 10*b* to the semiconductor switching element 1. Further, the semiconductor switching element 1 and each of the stress application portions 10*a* and 10*b* are inhibited from being separated from each other, and thus thermal reliability between the semiconductor switching element 1 and each of the stress application portions 10*a* and 10*b* can be improved. The joining layer is formed by using, for example, a material that is metal particles such as silver particles or copper particles and that is harder than solder. If metal particles are used for the joining layer, the semiconductor switching element 1 and each of the stress application portions 10a and 10b are joined together by heating, pressure application, or both heating and pressure application. If a hard material such as metal particles is used, stress that is applied from each of the stress application portions 10a and 10b to the semiconductor switching element 1 can be increased as compared to the case where no hard material is used.

The present disclosure is not limited to the configuration in which the semiconductor switching element 1 and each of the stress application portions 10a and 10b are joined together via the joining layer. A configuration may be employed in which the semiconductor switching element 1 and each of the stress application portions 10a and 10b are in contact with each other. If the semiconductor switching element 1 and each of the stress application portions 10a and 10b are brought into contact with each other by, for example, pressure welding, the stress application portions 10a and 10b have a function of applying stresses to the semiconductor switching element 1 and a function of joining the semiconductor switching element 1 and the heat dissipating member 2 together. If the semiconductor switching element 1 and each of the stress application portions 10a and 10b are in contact with each other, no joining layer is necessary, and thus productivity for the semiconductor module 100 can be improved.

Advantageous effects exhibited when compressive stress or tensile stress is generated in the semiconductor switching element 1, will be described. A threshold voltage (Vth) which is a gate voltage necessary for causing a current having at least a predetermined fixed value to flow between the source and the drain (between the emitter and the collector) in the semiconductor switching element 1, is negatively dependent on temperature. As indicated by a solid line in FIG. 5, the threshold voltage of the semiconductor switching element 1 increases in association with decrease of the temperature thereof. If the threshold voltage increases, the ON resistance (channel resistance) of the semiconductor switching element 1 increases, and the turn-off surge voltage thereof also increases. Therefore, the waveform of voltage that is applied to the semiconductor switching element 1 when the temperature decreases, is a waveform such as one indicated by a solid line in FIG. 6.

The semiconductor switching element 1 has a characteristic that the threshold voltage at which the semiconductor switching element 1 is turned on, decreases in association with increase of the magnitude of compressive stress or tensile stress that is applied to the semiconductor switching element 1. In the case of using the stress application portions 10a and 10b made of copper, thermal shrinkage of the stress application portions 10a and 10b becomes more prominent and compressive stress generated in the semiconductor switching element 1 is also intensified more, in association with decrease of the temperature of the semiconductor module 100. Therefore, the advantageous effect of decreasing the threshold voltage of the semiconductor switching element 1 increases more in association with decrease of the temperature of the semiconductor module 100.

FIG. 5 shows, by an alternate long and short dash line, an example of a result in which the characteristic that the threshold voltage decreases at the time of application of stress is added to the temperature characteristic (indicated by the solid line in FIG. 5) of the threshold voltage of the semiconductor switching element 1. The temperature characteristic of the threshold voltage indicated by the alternate long and short dash line has a more moderate slope than the conventional characteristic (indicated by the solid line) that involves no application of stress. A notable feature in FIG. 5 is that, when stress is applied, the solid line in FIG. 5 is not parallelly shifted, but the temperature characteristic comes to have a moderate slope while pivoting on the threshold voltage at a temperature T2. This characteristic makes it possible to suppress increase of the threshold voltage at low temperature while retaining a threshold voltage that is necessary at the time of high temperature.

FIG. 6 shows, by an alternate long and short dash line, an example of a result regarding the waveform of voltage at a temperature T1 at which stress has been applied, in addition to the waveform (indicated by a solid line in FIG. 6) of voltage that is applied to the semiconductor switching element 1 at the time of decrease of temperature. Increase of the threshold voltage at low temperature is suppressed, and thus, as indicated by the alternate long and short dash line in FIG. 6, increase of turn-off surge voltage and increase of turn-off surge rate that are caused by increase of the threshold voltage of the semiconductor switching element 1 at low temperature, can be suppressed at a time t1. Further, since increase of the threshold voltage can be suppressed, increase of the ON resistance can also be suppressed. Thus, it becomes unnecessary to, in designing of the semiconductor switching element 1, increase the current-conduction area of the semiconductor switching element 1 and set a rated voltage of the semiconductor switching element 1 to be high in order to avoid increase of ON resistance and increase of turn-off surge voltage at low temperature. Therefore, the area of the semiconductor switching element 1 can be decreased, and the rated voltage of the semiconductor switching element 1 can be decreased. By moderating the temperature characteristic of the threshold voltage of the semiconductor switching element 1, the area of the semiconductor switching element 1 and the rated voltage of the semiconductor switching element 1 can be decreased. This makes it possible to obtain a small-sized inexpensive semiconductor module in which increase of ON resistance and increase of turn-off surge voltage at low temperature are suppressed.

The temperature characteristic of the threshold voltage is considered to be influenced by the extent to which stress is applied not to the second surface 1b of the semiconductor switching element 1 but to the first surface 1a thereof on which the channel region is formed. Therefore, the stress application portions 10a and 10b are desirably disposed such that stress is generated in the first surface 1a. The arrangement, the sizes, and the number of the stress application portions 10a and 10b for generating stress in the first surface 1a, are not limited to those in the configuration of the present embodiment. However, if the arrangement, the sizes, and the number are set to be equal to those in the configuration of the present embodiment, stress can be efficiently applied to the first surface 1a by a small number of stress application portions 10a and 10b. Further, since the number of the stress application portions 10a and 10b is small, productivity for the semiconductor module 100 can be improved. It is noted that the stress application portion may be provided on only one of the first surface 1a and the second surface 1b. If the stress application portion is provided on only one of the first surface 1a and the second surface 1b, the number of components decreases. Thus, the size of the semiconductor module 100 can be decreased, and productivity for the semiconductor module 100 can be improved.

Figure 8:
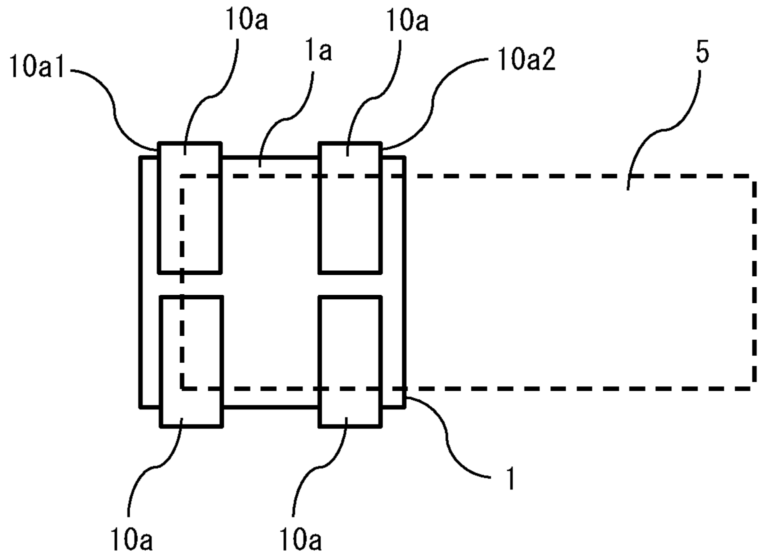
FIG. 8 is a plan view showing a major part of another semiconductor module according to the first embodiment.

As shown in FIG. 8, a plurality of stress application portions 10a may further be provided. FIG. 8 is a plan view showing a major part of another semiconductor module 100 according to the first embodiment. FIG. 8 is a diagram showing portions that are the first surface 1*a* side of the semiconductor switching element 1, stress application portions 10*a*, and the busbar 5 (broken line) while excluding the insulating resin material 6. With such a configuration, the magnitudes of stresses that are applied to the first surface 1*a* and regions in which the stresses are applied, can be changed. Thus, a desired temperature characteristic of the threshold voltage can easily be obtained. Although only an example in which the number of the stress application portions 10*a* is increased has been described in the present embodiment, the semiconductor module 100 is not limited to this example and may be configured by increasing the number of the stress application portions 10*b*. Further, the magnitudes of stresses that are applied to the first surface 1*a* and the regions in which the stresses are applied may be changed not only by changing the number of the stress application portions but also by changing the arrangement and the sizes of the stress application portions.

Figure 9:
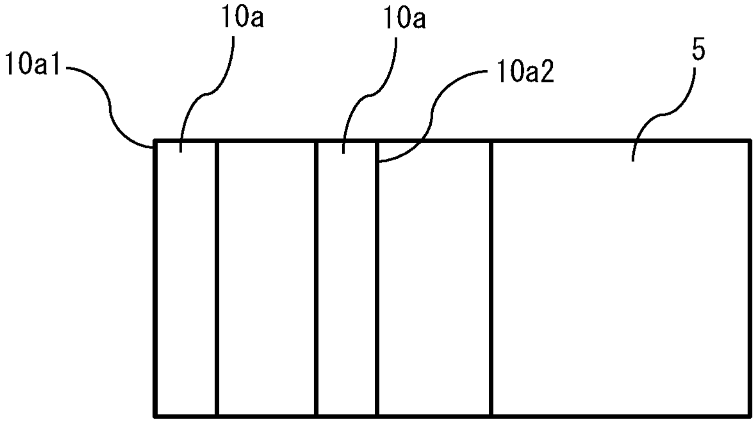
FIG. 9 is a plan view showing a major part of another semiconductor module according to the first embodiment.

Meanwhile, as shown in FIG. 9, each stress application portion 10*a* provided on the first surface 1*a* and the busbar 5 may be made of the same material, and the stress application portion 10*a* provided on the first surface 1*a* and the busbar 5 may be integrated with each other. FIG. 9 is a plan view showing a major part of another semiconductor module 100 according to the first embodiment and shows, from the semiconductor switching element 1 side, the stress application portion 10*a* and the busbar 5 integrated with each other. The material of the stress application portion 10*a* and the busbar 5 is, for example, copper. In the configuration shown in FIG. 9, the stress application portion 10*a* and the busbar 5 are formed to have the same width. If the stress application portion 10*a* and the busbar 5 are formed to have the same width, productivity for the stress application portion 10*a* and the busbar 5 integrated with each other can be improved. If the stress application portion 10*a* and the busbar 5 are made of the same material and integrated with each other in this manner, the number of components composing the semiconductor module 100 decreases, and a step of joining the stress application portion 10*a* and the busbar 5 together is eliminated. Thus, productivity for the semiconductor module 100 can be improved.

For the semiconductor switching element 1, silicon carbide, gallium oxide, or the like which are compound semiconductors harder than silicon can be used as a main material. Since compound semiconductors are harder than silicon, stresses that are applied from the stress application portions 10*a* and 10*b* to the semiconductor switching element 1 can be increased. Since stresses that are applied from the stress application portions 10*a* and 10*b* to the semiconductor switching element 1 are increased, the advantageous effect of moderating the temperature characteristic of the threshold voltage can be made more manifest. Further, compound semiconductors such as silicon carbide and gallium oxide are formed to have smaller thicknesses than silicon. Thus, if the semiconductor switching element 1 is made of a compound semiconductor, stresses that are applied from the stress application portions 10*a* and 10*b* to the semiconductor switching element 1 can be increased.

As described above, the semiconductor module 100 according to the first embodiment includes a stress application portion provided on one or each of the first surface 1*a* and the second surface 1*b* on the opposite side to the first surface 1*a* of the semiconductor switching element 1, the stress application portion having a linear expansion coefficient larger than a linear expansion coefficient of the main material of the semiconductor switching element 1, the stress application portion having a larger thickness than the semiconductor switching element 1. The stress application portion generates compressive stress or tensile stress in the semiconductor switching element 1 through thermal shrinkage or thermal expansion of the stress application portion due to change in temperature. The threshold voltage at which the semiconductor switching element 1 is turned on, decreases in association with increase of the magnitude of the compressive stress or the tensile stress in the semiconductor switching element 1. Consequently, increase of ON resistance and increase of turn-off surge voltage can be suppressed. Thus, the area of the semiconductor switching element 1 and the rated voltage of the semiconductor switching element 1 can be decreased. Therefore, a small-sized inexpensive semiconductor module 100 can be obtained.

If two or more stress application portions 10*a* are provided on the first surface 1*a*, one or more stress application portions 10*b* are provided on the second surface 1*b*, the two or more stress application portions 10*a* provided on the first surface 1*a* are disposed side by side in the first direction parallel to the first surface, and, as seen in the direction perpendicular to the first surface 1*a*, the one or more stress application portions 10*b* provided on the second surface 1*b* are disposed between the end 10*a*1 on one side in the first direction and the end 10*a*2 on another side in the first direction of the two or more stress application portions 10*a* provided on the first surface 1*a*, the stress application portions 10*a* and 10*b* can be disposed such that stresses are generated in the first surface 1*a*. Further, the magnitudes of stresses that are applied to the first surface 1*a* and the regions in which the stresses are applied can easily be changed by changing the number, the arrangement, and the sizes of the stress application portions. Thus, a desired temperature characteristic of the threshold voltage can easily be obtained.

If two stress application portions 10*a* are provided on the first surface 1*a*, one stress application portion 10*b* is provided on the second surface 1*b*, the two stress application portions 10*a* provided on the first surface 1*a* are disposed at an interval in the first direction parallel to the first surface 1*a*, and, as seen in the direction perpendicular to the first surface 1*a*, the one stress application portion 10*b* provided on the second surface 1*b* is disposed between the end 10*a*1 on one side in the first direction of the stress application portion 10*a* provided on the first surface 1*a* so as to be located on the one side in the first direction and the end 10*a*2 on another side in the first direction of the stress application portion 10*a* provided on the first surface 1*a* so as to be located on the other side in the first direction, stress can be efficiently applied to the first surface 1*a* by a small number of stress application portions 10*a* and 10*b*. Further, since the number of the stress application portions 10*a* and 10*b* is small, productivity for the semiconductor module 100 can be improved.

If the stress application portion is provided on each of the first surface 1*a* and the second surface 1*b*, and the semiconductor module 100 includes the busbar 5 connected to portions, of the stress application portions 10*a* provided on the first surface 1*a*, that are located on the opposite side to the semiconductor switching element 1 side and the heat dissipating member 2 connected to a portion, of the stress application portion 10*b* provided on the second surface 1*b*, that is located on the opposite side to the semiconductor switching element 1 side, the heat dissipating member 2 can easily dissipate heat generated from the busbar 5 and the semiconductor switching element 1, to outside. Further, if each stress application portion 10*a* provided on the first surface 1*a* and the busbar 5 are made of the same material and the stress application portion 10*a* provided on the first surface 1*a* and the busbar 5 are integrated with each other, the number of components composing the semiconductor module 100 decreases, and a step of joining the stress application portion 10*a* and the busbar 5 together is eliminated. Thus, productivity for the semiconductor module 100 can be improved.

If the semiconductor switching element 1 and each stress application portion are joined together via a joining layer so as not to slip on each other, stress can be efficiently applied from the stress application portions 10*a* and 10*b* to the semiconductor switching element 1, and thermal reliability between the semiconductor switching element 1 and each of the stress application portions 10*a* and 10*b* can be improved. Further, if the joining layer is formed by using metal particles harder than solder, stress that is applied from each of the stress application portions 10*a* and 10*b* to the semiconductor switching element 1 can be increased.

If the semiconductor switching element 1 and the stress application portion are in contact with each other, no joining layer is necessary, and thus productivity for the semiconductor module 100 can be improved. Further, if the main material of the semiconductor switching element 1 is a compound semiconductor harder than silicon, stresses that are applied from the stress application portions 10*a* and 10*b* to the semiconductor switching element 1 can be increased. Thus, the advantageous effect of moderating the temperature characteristic of the threshold voltage can be made more manifest.

Second Embodiment

Figure 10:
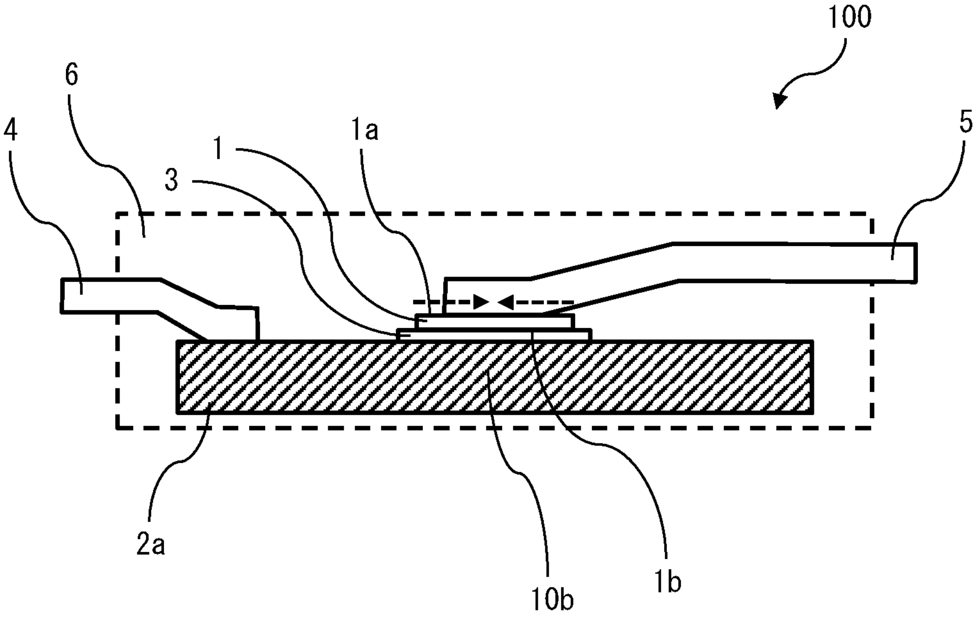
FIG. 10 is a cross-sectional view schematically showing a semiconductor module according to a second embodiment.
Figure 11:
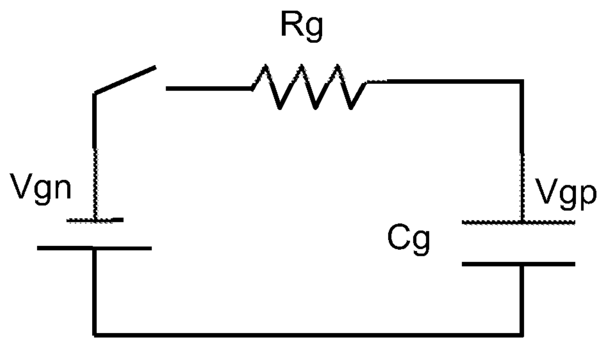
FIG. 11 is a diagram showing an equivalent circuit in which a semiconductor switching element in the semiconductor module according to the second embodiment is simulated to be turned off.
Figure 12:
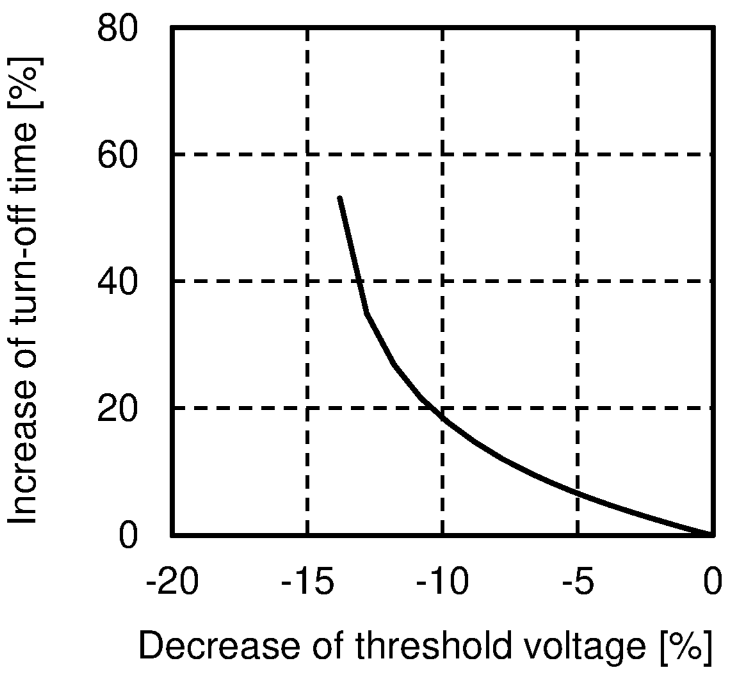
FIG. 12 is a diagram showing a correlation between the amount of decrease of the threshold voltage of the semiconductor switching element in the semiconductor module according to the second embodiment, and the amount of increase of a turn-off time of the said semiconductor switching element.
Figure 13:
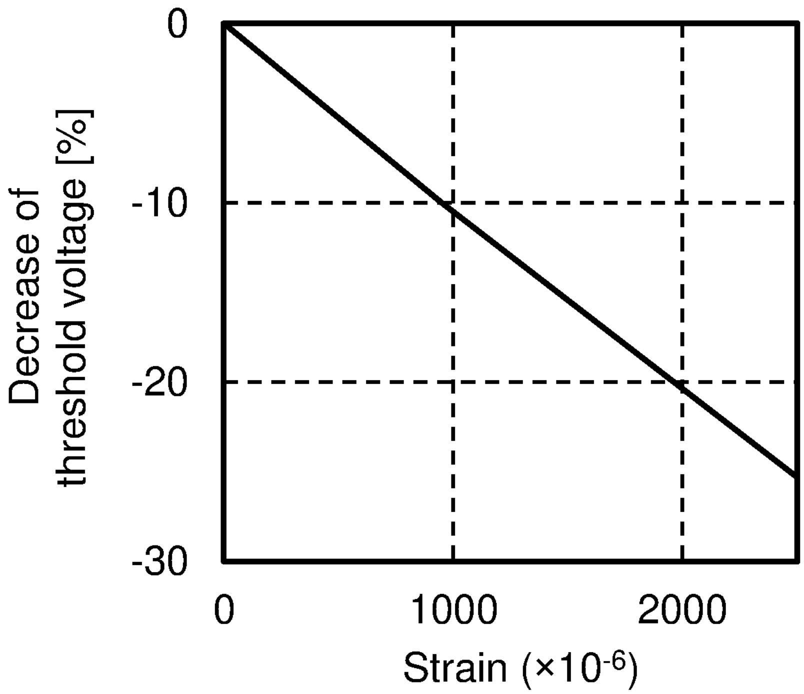
FIG. 13 is a diagram showing a correlation between a strain generated on a front surface of the semiconductor switching element in the semiconductor module according to the second embodiment, and the amount of change in the threshold voltage of the said semiconductor switching element.
Figure 14:
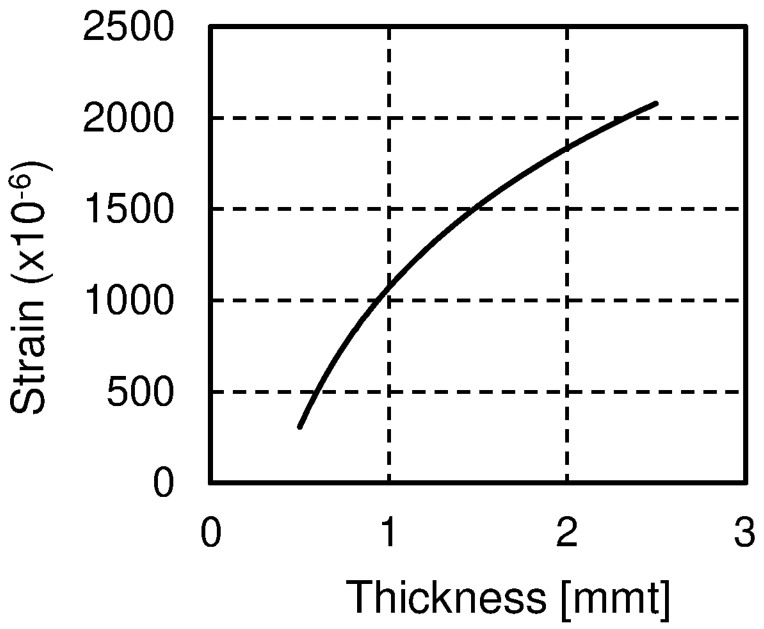
FIG. 14 is a diagram showing a correlation between the thickness of a stress application portion in the semiconductor module according to the second embodiment, and the strain generated on the front surface of the semiconductor switching element.

A semiconductor module 100 according to a second embodiment will be described. FIG. 10 is a cross-sectional view schematically showing the semiconductor module 100 according to the second embodiment, taken at the same position as the cross-sectional position A-A in FIG. 1. FIG. 11 is a diagram showing an equivalent circuit in which a semiconductor switching element 1 in the semiconductor module 100 is simulated to be turned off. FIG. 12 is a diagram showing a correlation between the amount of decrease of the threshold voltage of the semiconductor switching element 1 in the semiconductor module 100, and the amount of increase of a turn-off time of the said semiconductor switching element 1. FIG. 13 is a diagram showing a correlation between a strain generated on a front surface of the semiconductor switching element 1 in the semiconductor module 100, and the amount of change in the threshold voltage of the said semiconductor switching element 1. FIG. 14 is a diagram showing a correlation between the thickness of a stress application portion in the semiconductor module 100, and the strain generated on the front surface of the semiconductor switching element 1. In the semiconductor module 100 according to the second embodiment, a portion of a heat dissipating plate 2*a* as the heat dissipating member that is joined to the second surface 1*b* serves as the stress application portion 10*b* provided on the second surface 1*b*, unlike in the first embodiment.

<Semiconductor Module 100>

As shown in FIG. 10, the semiconductor module 100 includes: the semiconductor switching element 1; the heat dissipating plate 2*a* as the heat dissipating member; the busbars 4 and 5; a joining layer 3 joining the semiconductor switching element 1 and the heat dissipating plate 2*a* together; and the insulating resin material 6 covering these components. In FIG. 10, the external shape of the insulating resin material 6 is indicated by a broken line. The semiconductor switching element 1 is a power semiconductor formed in a plate shape and containing silicon carbide as the main material. The busbar 5 is connected to the first surface 1*a* side of the semiconductor switching element 1 by means of, for example, solder. The heat dissipating plate 2*a* is formed in a plate shape, is joined to the second surface 1*b* of the semiconductor switching element 1 via the joining layer 3, is made of copper, and has a plate surface that has an external shape larger than the external shape of the semiconductor switching element 1. The portion of the heat dissipating plate 2*a* that is joined to the second surface 1*b* is the stress application portion 10*b* provided on the second surface 1*b*.

The heat dissipating plate 2*a* has the function of the electrode connected to the second surface 1*b*, and the busbar 4 is connected to the heat dissipating plate 2*a* by means of, for example, solder. The heat dissipating plate 2*a* is thermally and electrically connected to the semiconductor switching element 1 and dissipates heat generated in the semiconductor switching element 1, to outside. Further, the heat dissipating plate 2*a* dissipates heat generated in the busbar 5 via the semiconductor switching element 1, to outside. The busbars 4 and 5 are provided such that parts thereof are exposed to outside from the insulating resin material 6. The busbars 4 and 5 are, at the parts thereof exposed to outside, connected to external devices. Each of the busbars 4 and 5 is made of, for example, copper having high electric conductivity. The thickness of the semiconductor switching element 1 is 200 μm or smaller, and the thickness of the heat dissipating plate 2*a* is 1 mm or larger. The reasons why the components are set to have these dimensions, will be described later.

With such a configuration, compressive stresses (broken-line arrows in FIG. 10) can be applied to the semiconductor switching element 1 by using thermal shrinkage of the stress application portion 10*b* due to decrease of temperature, in the same manner as in the first embodiment. The application of the compressive stresses makes it possible to decrease the threshold voltage of the semiconductor switching element 1. The decrease of the threshold voltage makes it possible to suppress increase of ON resistance and increase of turn-off surge voltage. Thus, the area of the semiconductor switching element 1 and the rated voltage of the semiconductor switching element 1 can be decreased. Therefore, a small-sized inexpensive semiconductor module can be obtained. Furthermore, the number of components is smaller than that in the first embodiment, and thus the size of the semiconductor module 100 can be further decreased. Moreover, the number of manufacturing steps is decreased, and thus cost for manufacturing is decreased. Therefore, productivity for the semiconductor module 100 can be improved.

<Thicknesses of Semiconductor Switching Element 1 and Heat Dissipating Plate 2*a*>

The reasons for setting the thickness of the semiconductor switching element 1 to be 200 μm or smaller and setting the thickness of the heat dissipating plate 2*a* to be 1 mm or larger, will be described. A trend of conducting studies to replace conventional silicon with silicon carbide as a main material for semiconductor switching elements 1, has intensified in recent years. Silicon carbide has more excellent physical property values of a power semiconductor material such as heat conductivity and dielectric breakdown field, than silicon. Therefore, silicon carbide is a semiconductor material regarded as a viable prospect for realizing a power conversion device that incurs lower loss and that has a smaller size. Meanwhile, as the thickness of the semiconductor switching element 1 is smaller, the resistance thereof becomes lower. Therefore, the thickness of the semiconductor switching element 1 tends to be made as small as possible in designing of the power conversion device, regardless of whether the semiconductor switching element 1 is made of silicon carbide. In particular, since silicon carbide has a higher dielectric breakdown field than silicon, the thickness of a layer necessary for retaining a withstand voltage can be made smaller than in the case of using silicon. In view of the above premises, the thickness of the semiconductor switching element 1 made of silicon carbide is, in general, 200 μm or smaller in many cases. The present embodiment gives description regarding the case where the semiconductor switching element 1 containing silicon carbide as the main material is formed to have a thickness of 200 μm.

If the temperature characteristic of the threshold voltage of the semiconductor switching element 1 is moderated and increase of the threshold voltage at low temperature is suppressed, a switching time during turn-off of the semiconductor switching element 1 increases. Thus, the amount of temporal change in current during turn-off decreases, and a surge voltage that is generated according to the amount of temporal change in current and a parasitic inductance of a circuit, decreases. A switching turn-off time with respect to change in the threshold voltage of the semiconductor switching element 1 can be regarded as a process of electrical discharge from a gate capacitance Cg in the equivalent circuit shown in FIG. 11. If a gate resistance is defined as Rg, the gate capacitance is defined as Cg, a voltage applied to a capacitor at the start of electrical discharge is defined as Vgp, and a gate negative bias is defined as Vgn in FIG. 11, a temporal change V(t) in the capacitor voltage in the equivalent circuit is expressed with expression (1).

$$V(t) = (V_{gp} - V_{gn}) \cdot e^{-\frac{t}{RgCg}} + V_{gn} \quad \text{[Mathematical 1]}$$

The turn-off time during switching is an electrical discharge time in which the capacitor voltage drops from a voltage Vm at the end of a mirror period to a threshold voltage Vth. Thus, the turn-off time during switching is expressed with expression (2).

$$t_{off} = R_g \cdot C_g \cdot \ln\left[\frac{V_m - V_{gn}}{V_{th} - V_{gn}}\right] \quad \text{[Mathematical 2]}$$

From expression (2), the turn-off time during switching is known to change nonlinearly with respect to change in the threshold voltage. FIG. 12 shows an example of the relationship of the proportion of change in the time required for switching turn-off with respect to the proportion of change in the threshold voltage of the semiconductor switching element 1 made of silicon carbide. When the threshold voltage of the semiconductor switching element 1 decreases by at least 10%, the turn-off time steeply increases. That is, in order to significantly suppress increase of turn-off surge voltage, it is effective to decrease the threshold voltage by at least 10%.

FIG. 13 shows the relationship between the amount of strain generated on the first surface 1*a* which is the front surface of the semiconductor switching element 1 made of silicon carbide, and the proportion of change in the threshold voltage of the semiconductor switching element 1. As described above, the first surface 1*a* of the semiconductor switching element 1 is a surface on the side on which the source electrode of the MOSFET and the channel region serving as a factor in determining the threshold voltage, are formed. The writers have confirmed that, as shown in FIG. 13, the threshold voltage of the semiconductor switching element 1 decreases in association with increase of the amount of strain generated on the first surface 1*a* of the semiconductor switching element. In the case of using silicon carbide for the semiconductor switching element 1, it is known from FIG. 13 that a strain of $1000\times10^{-6}$ needs to be generated on the first surface 1*a* of the semiconductor switching element 1 in order to decrease the threshold voltage by 10%.

FIG. 14 shows a result obtained through: joining of silicon carbide formed in a plate shape and having a thickness of 200 μm onto a copper plate via a joining layer at high temperature; and calculation of the amount of strain based on stress applied to the front surface of the silicon carbide on an opposite side to the copper plate side, with the thickness of the copper plate varying. In association with increase of the thickness of the copper plate, the stress applied to the front surface of the silicon carbide increases and the amount of strain generated on the front surface increases. It is known that a heat dissipating plate 2*a* having a portion as the stress application portion 10*b* only has to be formed by using a copper plate having a thickness of 1 mm or larger, in order to generate a strain of $1000\times10^{-6}$ on the front surface of the semiconductor switching element 1 so as to change the threshold voltage by 10%.

Judging from the above observations, it can be said that the portion as the stress application portion 10*b* is desirably formed to have a thickness of 1 mm or larger, in order to effectively suppress increase of switching surge voltage at low temperature in the semiconductor module 100 including: the semiconductor switching element 1 having a thickness of 200 μm and made of silicon carbide; and the heat dissipating plate 2*a* made of copper and having the portion as the stress application portion 10*b*. It is noted that the heat dissipating plate 2*a* only has to be made of copper at the portion as the stress application portion 10*b*, and the other portion excluding the portion as the stress application portion 10*b* may be made of another material.

Although the case where the thickness of the semiconductor switching element 1 made of silicon carbide is set to 200 μm has been described, the semiconductor switching element 1 may be formed to have a thickness smaller than 200 μm. If the semiconductor switching element 1 is formed to have a thickness smaller than 200 μm, the rigidity of the semiconductor switching element 1 decreases. Thus, when the semiconductor switching element 1 receives, from the stress application portion 10*b*, the same level of stress as that obtained if the thickness is 200 μm, the amount of strain generated on the front surface of the semiconductor switching element 1 increases. As a result, the advantageous effect of decreasing the threshold voltage at low temperature increases. Thus, the advantageous effect of suppressing increase of the turn-off surge voltage during switching and the advantageous effect of suppressing increase of ON resistance, can be increased more. Alternatively, the thickness of the portion as the stress application portion 10*b* may be set to be larger than 1 mm without changing the thickness of the semiconductor switching element 1. If the thickness of the portion as the stress application portion 10*b* is set to be larger than 1 mm, stress that is applied to the semiconductor switching element 1 increases. Thus, the same advantageous effect as that obtained if the thickness of the semiconductor switching element 1 is set to be small, can be obtained.

<Joining Layer 3>

The joining layer 3 is formed by using, for example, a material that is metal particles such as silver particles or copper particles and that is harder than solder. In the case of using a hard material such as metal particles for the joining layer 3, stress that is applied from the stress application portion 10*b* to the semiconductor switching element 1 can be increased as compared to the case where no hard material is used. The thickness of the joining layer 3 is about 10 μm to 50 μm.

A desirable joining layer 3 is one that has as small a thickness as possible and that has a linear expansion coefficient approximate to the linear expansion coefficient of the semiconductor switching element 1. If the thickness of the joining layer 3 is large, stress that is transmitted from the portion as the stress application portion 10*b* to the semiconductor switching element 1 is weakened, and thus the advantageous effect of moderating the temperature characteristic of the threshold voltage of the semiconductor switching element 1 decreases. Likewise, if there is a difference in linear expansion coefficient between the semiconductor switching element 1 and the joining layer 3, stress that is transmitted from the portion as the stress application portion 10*b* to the semiconductor switching element 1 is weakened, and thus the advantageous effect of moderating the temperature characteristic of the threshold voltage of the semiconductor switching element 1 decreases. If stress that is applied from the portion as the stress application portion 10*b* to the semiconductor switching element 1 is weakened by the joining layer 3, a heat dissipating plate 2*a* having a larger thickness may be used. Use of the heat dissipating plate 2*a* having a large thickness makes it possible to, even if stress is weakened by the joining layer 3, apply a required amount of stress to the semiconductor switching element 1 and obtain the desired advantageous effect of moderating the temperature characteristic of the threshold voltage.

It is desirable that, as seen in the direction perpendicular to the first surface 1*a* of the semiconductor switching element 1, the external shape of the joining layer 3 is larger than the external shape of the semiconductor switching element 1 or has the same size as that of the external shape of the semiconductor switching element 1. The advantageous effect in the present disclosure can be obtained also if, as seen in the direction perpendicular to the first surface 1*a* of the semiconductor switching element 1, the joining layer 3 is formed in a region smaller than the external shape of the semiconductor switching element 1. However, if the joining layer 3 is formed to have a size equal to or larger than the size of the external shape of the semiconductor switching element 1, stress can be transmitted over the entire range from the portion as the stress application portion 10*b* to the semiconductor switching element 1. Therefore, if the joining layer 3 is formed to have a size equal to or larger than the size of the external shape of the semiconductor switching element 1, the advantageous effect in the present disclosure can be sufficiently exhibited.

<Number of Semiconductor Switching Elements 1>

Figure 15:
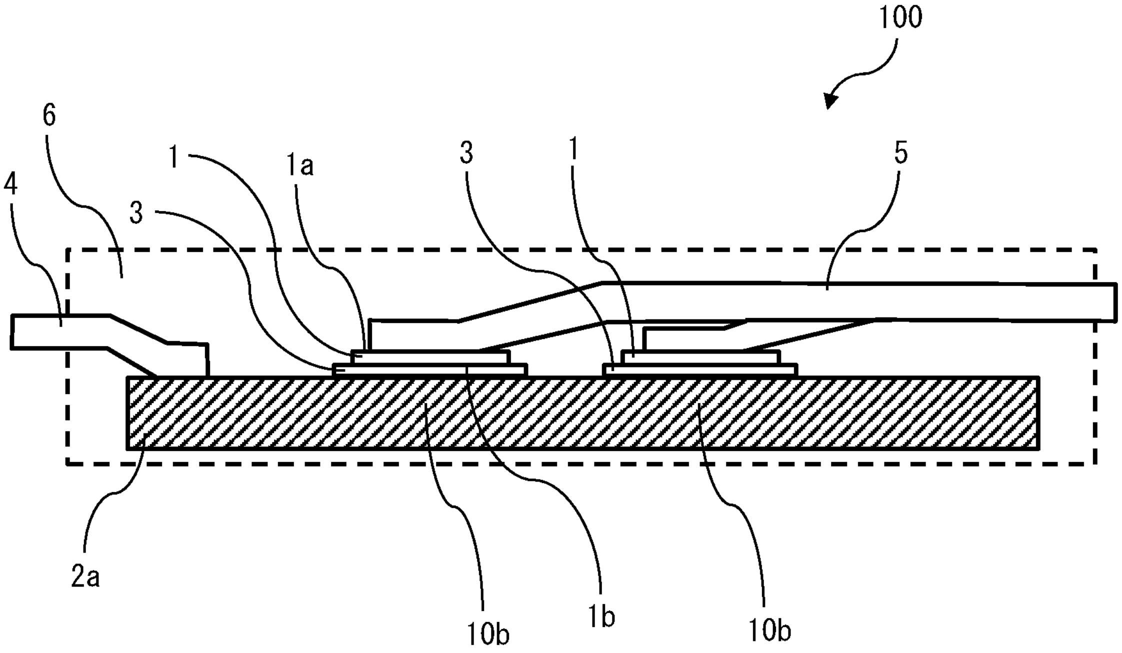
FIG. 15 is a side view schematically showing another semiconductor module according to the second embodiment.

A configuration may be employed in which a plurality of the semiconductor switching elements 1 are joined to the same surface of the heat dissipating plate 2*a* via joining layers 3. The present embodiment gives an example in which, as shown in FIG. 15, two semiconductor switching elements 1 are joined to the same surface of the heat dissipating plate 2*a*. FIG. 15 is a side view schematically showing another semiconductor module 100 according to the second embodiment and is a diagram excluding the insulating resin material 6. In a power conversion device adapted to high current, a method in which a plurality of the semiconductor switching elements 1 are disposed in parallel to ensure an amount of current is employed in many cases in consideration of the manufacturing yield of and cost for the semiconductor switching element 1. If the semiconductor switching element 1 is formed to be excessively large in association with increase of current, the yield of the semiconductor switching element 1 decreases. Therefore, the total cost can be made lower if a large number of semiconductor switching elements 1 having moderate sizes are arranged and connected in parallel. The size of the external shape of each semiconductor switching element 1 formed in a rectangular shape in the present embodiment is, for example, 4 mm×4 mm.

With such a configuration, the plurality of the semiconductor switching elements 1 can be disposed in parallel on the one heat dissipating plate 2*a*, and thus cost for the semiconductor switching elements 1 to ensure a required amount of current can be decreased. Further, if the plurality of the semiconductor switching elements 1 are arranged on and concurrently joined to the one heat dissipating plate 2*a*, the number of manufacturing steps is smaller than if stress application portions are individually provided on the respective semiconductor switching elements 1. Thus, productivity for the semiconductor module 100 can be improved. Further, the portions of the heat dissipating plate 2*a* that are joined to the respective semiconductor switching elements 1 are stress application portions 10*b*, and thus, for each of the plurality of the semiconductor switching elements 1, the advantageous effect of moderating the temperature characteristic of the threshold voltage of the said semiconductor switching element 1 can be obtained. It is noted that each joining layer 3 is provided directly beneath a corresponding one of the plurality of the semiconductor switching elements 1. The busbar 5 is provided to be connected to an electrode that is present on the first surface 1*a* of each of the plurality of the semiconductor switching elements 1.

Figure 16:
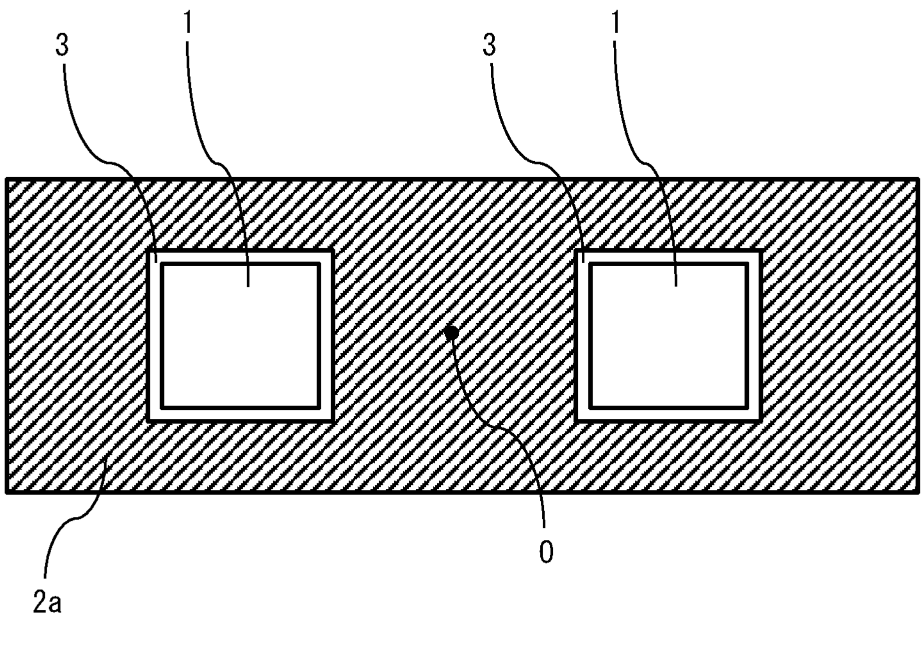
FIG. 16 is a plan view showing a major part of another semiconductor module according to the second embodiment.

FIG. 16 is a plan view showing a major part of another semiconductor module 100 according to the second embodiment. FIG. 16 is a diagram showing the first surface 1*a* sides of semiconductor switching elements 1, the heat dissipating plate 2*a*, and joining layers 3 while excluding the insulating resin material 6. In the case of providing two semiconductor switching elements 1, a point at which the maximum stress is generated on the front surface of the heat dissipating plate 2*a*, i.e., a center O of the heat dissipating plate 2*a* in FIG. 16, may be regarded as an origin, and the two semiconductor switching elements 1 may be disposed at positions that are symmetrical with each other about the origin. With such a configuration, stresses that are applied to the respective semiconductor switching elements 1 are equalized, and thus the threshold voltages of the respective semiconductor switching elements 1 are equalized. As a result, unevenness in current during switching can be decreased. Thus, the highest current that flows to each semiconductor switching element 1 is decreased, and the advantageous effect of suppressing increase of turn-off surge voltage can be further improved.

Figure 17:
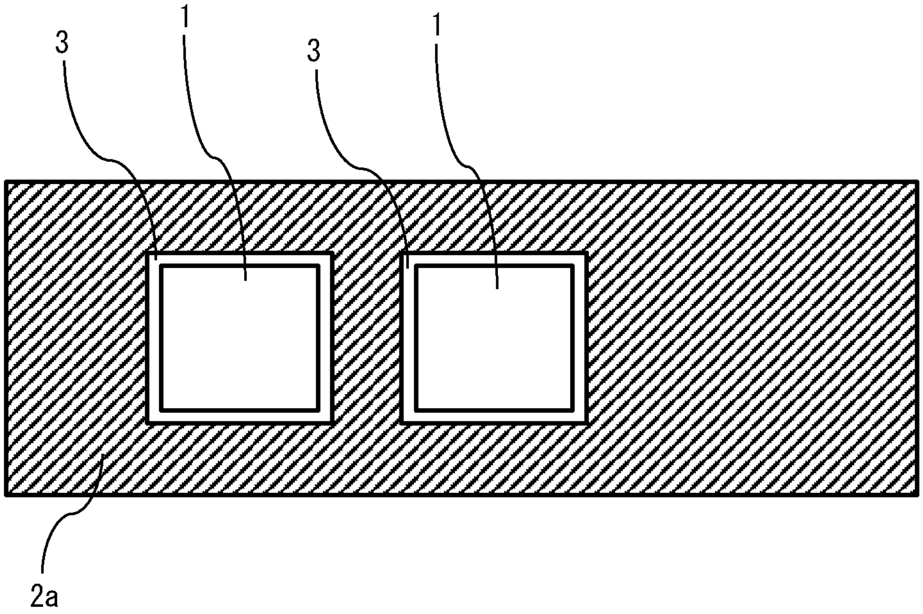
FIG. 17 is a plan view showing a major part of another semiconductor module according to the second embodiment.

FIG. 17 is a plan view showing a major part of another semiconductor module 100 according to the second embodiment. FIG. 17 is a diagram showing the first surface 1*a* sides of the semiconductor switching elements 1, the heat dissipating plate 2*a*, and the joining layers 3 while excluding the insulating resin material 6. FIG. 17 shows an example in which the semiconductor switching elements 1 are disposed at positions that are not symmetrical with each other about the origin on the heat dissipating plate 2*a*, unlike the semiconductor switching elements 1 disposed as shown in FIG. 16. There is a case where it is known in advance that unevenness among the amounts of currents that flow to the respective semiconductor switching elements 1 occurs owing to influences of, for example, the wire lengths and the wire arrangement of the busbars 4 and 5 in the semiconductor module 100. In this case, change of the stresses that are applied to the respective semiconductor switching elements 1 enables adjustment such that the threshold voltage of a specific one of the semiconductor switching elements 1 is decreased more than the other threshold voltages so as to attain balance among the amounts of currents to the respective semiconductor switching elements 1. Consequently, increase of turn-off surge voltage at the time of switching at low temperature can be further suppressed.

As described above, the semiconductor module 100 according to the second embodiment includes: the semiconductor switching element 1 containing silicon carbide as the main material; the busbar 5; and the heat dissipating plate 2*a* joined to the second surface 1*b* of the semiconductor switching element 1 via the joining layer 3, the heat dissipating plate 2*a* being made of copper and having a plate surface that has an external shape larger than the external shape of the semiconductor switching element 1. A portion of the heat dissipating plate 2*a* that is joined to the second surface 1*b* is the stress application portion 10*b* provided on the second surface 1*b*. The thickness of the semiconductor switching element 1 is 200 μm or smaller, and the thickness of the heat dissipating plate 2*a* is 1 mm or larger. Consequently, increase of the switching surge voltage of the semiconductor switching element 1 at low temperature can be effectively suppressed.

If the joining layer 3 is formed by using metal particles harder than solder and, as seen in the direction perpendicular to the first surface 1*a* of the semiconductor switching element 1, the external shape of the joining layer 3 is larger than the external shape of the semiconductor switching element 1 or has the same size as that of the external shape of the semiconductor switching element 1, stress can be transmitted over the entire range from the portion as the stress application portion 10*b* to the semiconductor switching element 1. Thus, increase of the switching surge voltage of the semiconductor switching element 1 at low temperature can be further effectively suppressed.

If a plurality of the semiconductor switching elements 1 are joined to the same surface of the heat dissipating plate 2*a* via the joining layers 3, productivity for the semiconductor module 100 can be improved. This is because, if the plurality of the semiconductor switching elements 1 are arranged on and concurrently joined to the one heat dissipating plate 2*a*, the number of manufacturing steps is smaller than if stress application portions are individually provided on the respective semiconductor switching elements 1. Further, the portions of the heat dissipating plate 2*a* that are joined to the respective semiconductor switching elements 1 are the stress application portions 10*b*, and thus, for each of the plurality of the semiconductor switching elements 1, the advantageous effect of moderating the temperature characteristic of the threshold voltage of the said semiconductor switching element 1 can be obtained.

Third Embodiment

Figure 18:
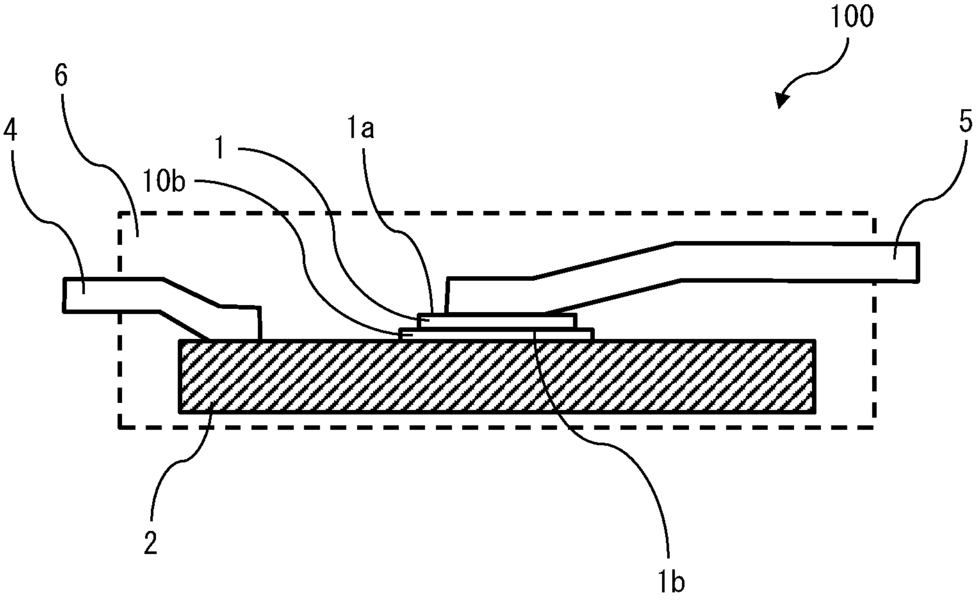
FIG. 18 is a cross-sectional view schematically showing a semiconductor module according to a third embodiment.

A semiconductor module 100 according to a third embodiment will be described. FIG. 18 is a cross-sectional view schematically showing the semiconductor module 100 according to the third embodiment, taken at the same position as the cross-sectional position A-A in FIG. 1. The semiconductor module 100 according to the third embodiment is different from that according to the second embodiment in that a stress application portion 10*b* is provided. Further, the semiconductor module 100 according to the third embodiment is different from that according to the first embodiment in that no stress application portion 10*a* is provided but only the stress application portion 10*b* is provided as a stress application portion.

One or more stress application portions 10*b* are provided on the second surface 1*b* of the semiconductor switching element 1. In the present embodiment, one stress application portion 10*b* is provided to have a size larger than the size of the external shape of the semiconductor switching element 1, and the one stress application portion 10*b* is made of copper having a thickness of 1 mm or larger. The shapes, the materials, and the number of the stress application portions 10*b* are not limited thereto and may be other shapes, materials, and numbers as long as stress can be applied to a desired position on the semiconductor switching element 1. The stress application portion 10*b* and the semiconductor switching element 1 are joined together via, for example, a joining layer (not shown).

The semiconductor module 100 includes the heat dissipating member 2 connected to a portion, of the stress application portion 10*b* provided on the second surface 1*b*, that is located on the opposite side to the semiconductor switching element 1 side. The heat dissipating member 2 and the stress application portion 10*b* are connected to each other by means of, for example, solder. The heat dissipating member 2 has the function of the electrode connected to the second surface 1*b*, and the busbar 4 is connected to the heat dissipating member 2. The busbar 5 is connected to the first surface 1*a* side of the semiconductor switching element 1 by means of, for example, solder. In the present embodiment, the number of components is smaller than in the configuration of the first embodiment shown in FIG. 2 since no stress application portion 10*a* is provided. Thus, the size of the semiconductor module 100 can be decreased.

Unlike in the second embodiment in which the portion of the heat dissipating plate 2*a* that is joined to the second surface 1*b* is the stress application portion 10*b* provided on the second surface 1*b*, the configuration described in the third embodiment makes it possible to provide the stress application portion 10*b* and the heat dissipating member 2 as separate members. Therefore, adjustment of the threshold voltage by means of application of stress to the semiconductor switching element 1 by the stress application portion 10*b*, and the performance of heat dissipation from the semiconductor switching element 1 by the heat dissipating member 2, can be separately considered. Thus, the structure of the semiconductor module 100 can be designed more easily than in the second embodiment. For example, if the performance of heat dissipation is sufficient and the threshold voltage of the semiconductor switching element 1 is desired to be further decreased, the material or the thickness of the stress application portion 10*b* only has to be changed. In this case, design of the heat dissipating member 2 does not need to be changed, and the thickness of the heat dissipating member 2 can be kept at a minimum necessary thickness. Thus, cost for the semiconductor module 100 can be decreased.

In the present embodiment, if the semiconductor module 100 includes a plurality of the semiconductor switching elements 1, the stress application portion 10*b* can be provided on each semiconductor switching element 1. Therefore, for each semiconductor switching element 1, the amount of change in the threshold voltage thereof can be adjusted by changing, for example, the thickness and the material of the stress application portion 10*b* for the said semiconductor switching element 1. There is a case where it is known in advance that unevenness among the amounts of currents that flow to the respective semiconductor switching elements 1 occurs owing to influences of, for example, the wire lengths and the wire arrangement of the busbars 4 and 5 in the semiconductor module 100. In this case, change of stresses that are applied to the respective semiconductor switching elements 1 enables adjustment such that the threshold voltage of a specific one of the semiconductor switching elements 1 is decreased more than the other threshold voltages so as to attain balance among the amounts of currents to the respective semiconductor switching elements 1. Consequently, increase of turn-off surge voltage at the time of switching at low temperature can be further suppressed.

As described above, in the semiconductor module 100 according to the third embodiment, each of the one or more stress application portions 10*b* is provided on the second surface 1*b*, and the semiconductor module 100 includes the heat dissipating member 2 connected to the portion, of the stress application portion 10*b* provided on the second surface 1*b*, that is located on the opposite side to the semiconductor switching element 1 side. Thus, no stress application portion 10*a* is provided, and the number of components is small. Therefore, the size of the semiconductor module 100 can be decreased. Further, the stress application portion 10*b* and the heat dissipating member 2 can be provided as separate members, and thus adjustment of the threshold voltage by the stress application portion 10*b* and the performance of heat dissipation by the heat dissipating member 2 can be separately considered. Therefore, the structure of the semiconductor module 100 can be designed more easily than in the second embodiment.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the technical scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 semiconductor switching element
1*a* first surface
1*b* second surface
2 heat dissipating member
2*a* heat dissipating plate
3 joining layer
4 busbar
5 busbar
6 insulating resin material
10*a* stress application portion
10*a*1 end
10*a*2 end
10*b* stress application portion
100 semiconductor module

What is claimed is:

1. A semiconductor module comprising:
a singular semiconductor switching element; and
a plurality of stress application portions,
wherein two or more of the stress application portions provided on a first surface and one of the stress application portions are provided on a second surface on an opposite side to the first surface of the semiconductor switching element, the stress application portions having a linear expansion coefficient larger than a linear expansion coefficient of a main material of the semiconductor switching element, the stress application portions having a larger thickness than the semiconductor switching element,
wherein the stress application portions generate compressive stress or tensile stress in the semiconductor switching element through thermal shrinkage or thermal expansion of the stress application portions due to change in temperature, and
wherein a threshold voltage at which the semiconductor switching element is turned on, decreases in association with increase of a magnitude of the compressive stress or the tensile stress in the semiconductor switching element,
wherein the first surface is an upper surface of the semiconductor switching element and the second surface is a lower surface of the semiconductor switching element,
wherein the two or more of the stress application portions are provided on the upper surface with one of the stress application portions at a first end and another one of the stress application portions provided at a second end of the upper surface and spaced, in a first direction parallel to the upper surface, from a first edge of the first end of the upper surface and a second edge of the second end of the upper surface,
wherein only one of the application portions is provided on the lower surface,
wherein the two or more of the stress application portions provided on the upper surface are disposed side by side in the first direction parallel to the upper surface.

2. The semiconductor module according to claim 1, wherein
as seen in a direction perpendicular to the first surface, the one stress application portion provided on the lower surface is disposed between an end on one side in the first direction and an end on another side in the first direction of the two or more stress application portions provided on the first surface.

3. The semiconductor module according to claim 1, wherein
as seen in a direction perpendicular to the first surface, the one stress application portion provided on the second surface is disposed between an end on one side in the first direction of one of two or more the stress application portions provided on the first surface so as to be located on the one side in the first direction, and an end on another side in the first direction of another of the two or more stress application portions provided on the first surface so as to be located on the other side in the first direction.

4. The semiconductor module according to claim 1, wherein the semiconductor module further comprises a busbar connected to a portion, of the two or more stress application portions provided on the first surface, that is located on an opposite side to the semiconductor switching element side, and a heat dissipating member connected to a portion, of the one stress application portion provided on the second surface, that is located on an opposite side to the semiconductor switching element side.

5. The semiconductor module according to claim 4, wherein the two or more stress application portions provided on the first surface and the busbar are made of a same material, and the two or more stress application portions provided on the first surface and the busbar are integrated with each other.

6. The semiconductor module according to claim 1, wherein the semiconductor module further comprises a heat dissipating member connected to a portion, of the one stress application portion provided on the second surface, that is located on an opposite side to the semiconductor switching element side.

7. The semiconductor module according to claim 1, wherein the semiconductor switching element and the one or more stress application portions are joined together via a joining layer so as not to slip on each other.

8. The semiconductor module according to claim 7, wherein the joining layer is formed by using metal particles harder than solder.

9. The semiconductor module according to claim 1, wherein the semiconductor switching element and the one or more stress application portions are in contact with each other.

10. The semiconductor module according to claim 1, wherein the main material of the semiconductor switching element is a compound semiconductor harder than silicon.

11. The semiconductor module according to claim 1, comprising:

the semiconductor switching element formed in a plate shape and containing silicon carbide as the main material;

a busbar connected to the first surface side of the semiconductor switching element; and a heat dissipating member formed in a plate shape and joined to the second surface of the semiconductor switching element via a joining layer, the heat dissipating member being made of copper and having a plate surface that has an external shape larger than an external shape of the semiconductor switching element, wherein a portion of the heat dissipating member that is joined to the second surface is the one stress application portion provided on the second surface, and a thickness of the semiconductor switching element is 200 μm or smaller, and a thickness of the heat dissipating member is 1 mm or larger.

12. The semiconductor module according to claim 11, wherein the joining layer is formed by using metal particles harder than solder, and as seen in a direction perpendicular to the first surface of the semiconductor switching element, an external shape of the joining layer is larger than the external shape of the semiconductor switching element or has a same size as that of the external shape of the semiconductor switching element.

13. The semiconductor module according to claim 11, wherein each of a plurality of the semiconductor switching elements is joined to a same surface of the heat dissipating member via the joining layer.

* * * * *